(12) United States Patent
Hisaichi

(10) Patent No.: US 7,588,638 B2
(45) Date of Patent: Sep. 15, 2009

(54) SINGLE CRYSTAL PULLING APPARATUS

(75) Inventor: Toshio Hisaichi, Shibata (JP)

(73) Assignee: Covalent Materials Corporation, Tokyo (JP)

( * ) Notice: Subject to any disclaimer, the term of this patent is extended or adjusted under 35 U.S.C. 154(b) by 0 days.

(21) Appl. No.: 12/021,828

(22) Filed: Jan. 29, 2008

(65) Prior Publication Data
US 2008/0184929 A1    Aug. 7, 2008

(30) Foreign Application Priority Data
Feb. 6, 2007    (JP) ............................. 2007-026261

(51) Int. Cl.
*C30B 35/00* (2006.01)
(52) U.S. Cl. .................. 117/217; 117/200; 117/206; 117/218; 117/900
(58) Field of Classification Search ............... 117/30, 117/32, 208, 218, 917, 200, 206, 217, 900
See application file for complete search history.

(56) References Cited

U.S. PATENT DOCUMENTS

| | | | | |
|---|---|---|---|---|
| 5,792,255 A | * | 8/1998 | Iino et al. ..................... 117/32 |
| 5,868,831 A | * | 2/1999 | Dornberger et al. ........... 117/15 |
| 5,935,327 A | * | 8/1999 | Hariri et al. .................. 117/218 |
| 6,086,671 A | * | 7/2000 | Kawanishi et al. ............ 117/30 |
| 6,179,911 B1 | * | 1/2001 | Tomioka et al. ............... 117/20 |
| 6,200,384 B1 | * | 3/2001 | Kishida et al. ................ 117/30 |
| 6,899,758 B2 | * | 5/2005 | Abe et al. ..................... 117/13 |
| 2005/0081779 A1 | * | 4/2005 | Sonokawa et al. ............ 117/14 |
| 2006/0292890 A1 | * | 12/2006 | Ammon et al. ............. 438/770 |

FOREIGN PATENT DOCUMENTS

JP    2003-249501 A    9/2003

* cited by examiner

*Primary Examiner*—Felisa C Hiteshew
(74) *Attorney, Agent, or Firm*—Foley & Lardner LLP

(57) ABSTRACT

A single crystal pulling apparatus having a heater 4 melting material silicon by thermal radiation from a cylindrical exothermic part 4a which surrounds a crucible 3 inside a furnace body 2 and an electromagnet 13 which is prepared to surround the furnace body 2 and applies a transverse magnetic field to the silicon liquid melt in the crucible 3 is provided. A length h in a pull-up axis direction in the exothermic part 4a of the heater 4 is arranged to be 0.5 times to 0.9 times an inner diameter of the crucible 3, a first middle position in the pull-up axis direction in the exothermic part 4a is arranged below a second middle position in the pull-up axis direction in the electromagnet 13, and a distance difference d between the first and second middle positions is 0.15 times to 0.55 times the inner diameter R of the crucible 3.

4 Claims, 7 Drawing Sheets

SINGLE CRYSTAL PULLING APPARATUS

BACKGROUND OF THE INVENTION

1. Field of the Invention

The present invention relates to a single crystal pulling apparatus for growing and pulling up a single crystal by the Czochralski method (hereafter referred to as the "CZ method")

2. Description of the Related Art

The CZ method is widely used for growing a silicon single crystal. This method is such that a seed crystal is brought into contact with a surface of silicon liquid melt which is accommodated in a crucible, the crucible is rotated about a pull-up axis, and this seed crystal is pulled upwards and rotated in the opposite direction, whereby a single crystal is formed at a lower end of the seed crystal.

As shown in FIG. 6, in a pull-up method using a conventional CZ method, firstly a silica glass crucible 51 is filled with material polysilicon which is heated by a heater 52 so as to be silicon liquid melt M. After an appropriate time, a seed crystal P attached to a pulling wire 50 is brought into contact with the silicon liquid melt M, so that a silicon single crystal C is pulled up.

Generally, after a temperature of the silicon liquid melt M is stabilized in advance of starting the pulling, a necking process is carried out in which the seed crystal P is brought into contact with the silicon liquid melt M to melt a tip part of the seed crystal P, as shown in FIG. 7. By the necking process we mean an indispensable process for removing a dislocation produced in the silicon single crystal by a thermal shock generated due to contact between the seed crystal P and the silicon liquid melt M. A neck part P1 is formed by way of this necking process. Further, this neck part P1 generally requires a diameter of 3-4 mm and a length of 100 mm or more.

Further, as for processes after starting the pulling, a crowning process of extending a crystal to the extent of the straight body part diameter after completing the necking process, a straight body forming process of growing the single crystal used for a product, and a tail process of gradually reducing a single crystal diameter after the straight body forming process are performed.

Incidentally, the silicon single crystal obtained by way of such processes contains oxygen which is eluted from the silica glass crucible into the silicon liquid melt. The oxygen in this single crystal appears as an inner minute defect (bulk micro defect: BMD) which includes an oxygen deposit (core) in a wafer sliced from the single crystal. Since BMD can be used for an IG method (method of gettering impurities from inside) where a contaminating heavy metal included in the wafer is captured with distortion stress, it is preferable that a BMD density in the wafer is higher.

Further, Japanese Patent Publication (KOKAI) No. 2003-249501 (patent document 1) discloses that the wafer which is subjected to pre-annealing (heat treatment) to increase the BMD density can be inhibited from generating slip dislocations near the outermost perimeter and a holder of the wafer, even if it is subjected to a subsequent high temperature heat treatment. In other words, it is desirable to increase the BMD density in the wafer also from a viewpoint of dislocation inhibition effects.

As described above, it is desirable that the BMD density in the wafer is in a high state in terms of gettering the impurities and inhibiting the dislocations. To this end, however, it is necessary to grow a single crystal with a high oxygen concentration, preferably a single crystal having an oxygen concentration of $1.1\text{-}1.5 \times 10^{18}$ atoms/cm$^3$ over the whole length.

However, since the single crystal to be grown has been increased in diameter in recent years, convection of the silicon liquid melt in the crucible becomes irregular, the concentration of the oxygen or impurities carried by the convection and a liquid melt temperature at a crystal growth side becomes unstable, thus it is not possible to stably manufacture the single crystal having the high oxygen concentration over the whole length.

To cope with such a problem, a method is used in which a magnetic field is applied to the silicon liquid melt to inhibit the convection of the silicon liquid melt in the case of pulling the single crystal with a large diameter. However, it is difficult to obtain the single crystal with the high oxygen concentration (for example, $1.1\text{-}1.5 \times 10^{18}$ atoms/cm$^3$) over the whole length, merely by applying the magnetic field.

SUMMARY OF THE INVENTION

The present invention is made in a situation as described above, and provides a single crystal pulling apparatus in which a magnetic field is applied to silicon liquid melt in a crucible and a single crystal is pulled up from the crucible by the Czochralski method, so that the silicon single crystal having a high oxygen concentration can be obtained easily.

In order to solve the above mentioned problem, the single crystal pulling apparatus in accordance with the present invention is a single crystal pulling apparatus in which material silicon is melted to be silicon liquid melt in a crucible inside a furnace body and a single crystal is pulled up from the crucible rotating about a pull-up axis by the Czochralski method. A heater having a cylindrical exothermic part which surrounds the above-mentioned crucible inside the above-mentioned furnace body and melting the above-mentioned material silicon by thermal radiation from the above-mentioned exothermic part and an electromagnet which is prepared to surround the above-mentioned furnace body and applies a transverse magnetic field to the above-mentioned silicon liquid melt in the above-mentioned crucible are provided. A length in a pull-up axis direction in the exothermic part of the above-mentioned heater is arranged to be 0.5 times to 0.9 times an inner diameter of the above-mentioned crucible, a first middle position in the pull-up axis direction in the above-mentioned exothermic part is arranged below a second middle position in the pull-up axis direction in the above-mentioned electromagnet, and a distance difference between the first and second middle positions is 0.15 times to 0.55 times the inner diameter of the above-mentioned crucible. In addition, it is desirable that the inner diameter of the above-mentioned crucible is 800 mm or more.

Such a structure allows sufficient upward convection of the silicon liquid melt M from a crucible bottom by application of the magnetic field and it is possible to easily grow the single crystal with the high oxygen concentration over the whole length.

According to the present invention, it is possible to obtain the single crystal pulling apparatus in which the magnetic field is applied to the silicon liquid melt in the crucible and the single crystal is pulled up from the crucible by the Czochralski method, so that the silicon single crystal having the high oxygen concentration can be obtained easily.

DESCRIPTION OF THE PREFERRED EMBODIMENTS

Figure 1:
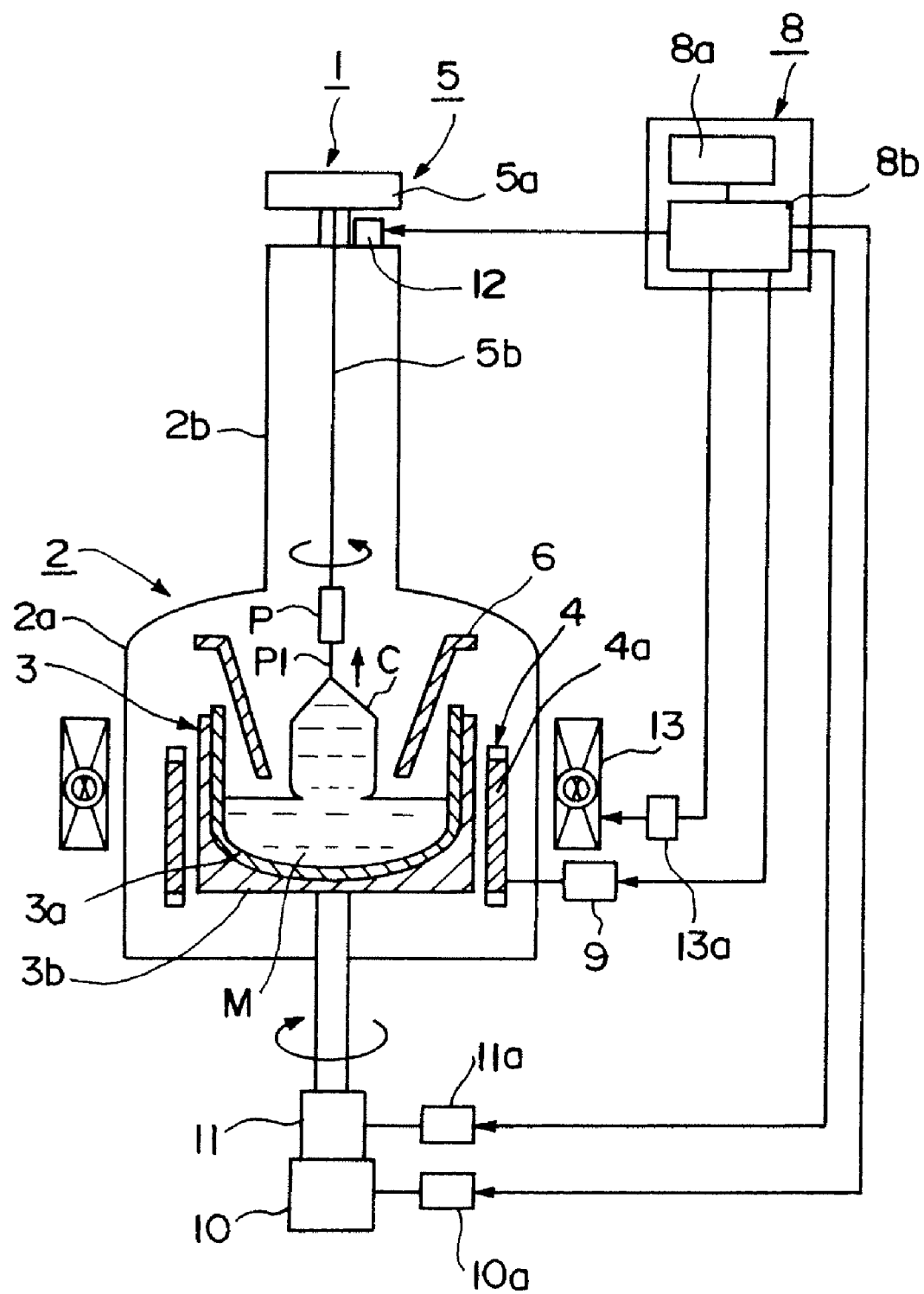
FIG. 1 is a block diagram schematically showing a structure of a single crystal pulling apparatus in accordance with the present invention.

Hereafter, the preferred embodiments of a single crystal pulling apparatus in accordance with the present invention will be described with reference to the drawings. FIG. 1 is a block diagram showing the whole single crystal pulling apparatus structure in accordance with the present invention.

This single crystal pulling apparatus 1 includes a furnace body 2 formed by placing a pull chamber 2b on a cylinder-like main chamber 2a, a crucible 3 provided in the furnace body 2, a resistance heating heater 4 (hereafter simply referred to as heater) for melting a semiconductor material (material polysilicon) M filled in the crucible 3, and a pull-up mechanism 5 for pulling up a single crystal C to be grown.

In addition, in the heater 4, a cylindrical slit part 4a is provided as an exothermic part so that the crucible 3 maybe surrounded. Further, the crucible 3 has a dual structure in which an inner side is constituted by a silica glass crucible 3a, and an outer side is constituted by a graphite crucible 3b. Further, the pull-up mechanism 5 has a rolling-up mechanism 5a driven by a motor and a pulling wire 5b which is wound on this rolling-up mechanism 5a. A seed crystal P is attached to a tip of this wire 5b.

Further, in the main chamber 2a, near and above the upper part of the crucible 3, a radiation shield 6 is provided whose upper part and lower part are formed to be open so that the single crystal C may be surrounded to shield the growing single crystal C from excessive radiant heat from the heater 4 etc. and rectify gas flow in the furnace. In addition, a distance size (gap) between a bottom end of the radiation shield 6 and a melt surface is controlled to maintain a predetermined distance according to a desired characteristic of the single crystal to be grown.

Further, as shown in FIG. 1, a magnetic field applying electric coil 13 (electromagnet) is provided outside the main chamber 2a so as to be surrounded, and the MCZ method (Magnetic field applied CZ method) is used in which a transverse magnetic field is applied in the silicon liquid melt of the crucible 3 to grow a single crystal.

In the present preferred embodiment, this MCZ method is used to form a predetermined magnetic field for the silicon liquid melt M so that the convection of the silicon liquid melt may be controlled to aim at stabilizing single-crystallization and the single crystal to be grown may have the high oxygen concentration over the whole length.

Further, as shown in FIG. 1, the single crystal pulling apparatus 1 is provided with a heater control unit 9 for controlling electric energy supply to the heater 4 which controls the temperature of the silicon liquid melt M, a motor 10 for rotating the crucible 3 about the pull-up axis, and a motor control unit 10a for controlling the number of rotations of the motor 10. Furthermore, it has a lift apparatus 11 for controlling a height of the crucible 3, a lift apparatus control unit 11a for controlling the lift apparatus 11, and a wire reel rotating apparatus control unit 12 for controlling a pull-up speed and the number of rotations of the growing crystal. Still further, it includes an electric coil control unit 13a for performing motion control of the magnetic field applying electric coil 13. Each of these control units 9, 10a, 11a, 12, and 13a is connected to an arithmetic control unit 8b of a computer 8.

Figure 2:
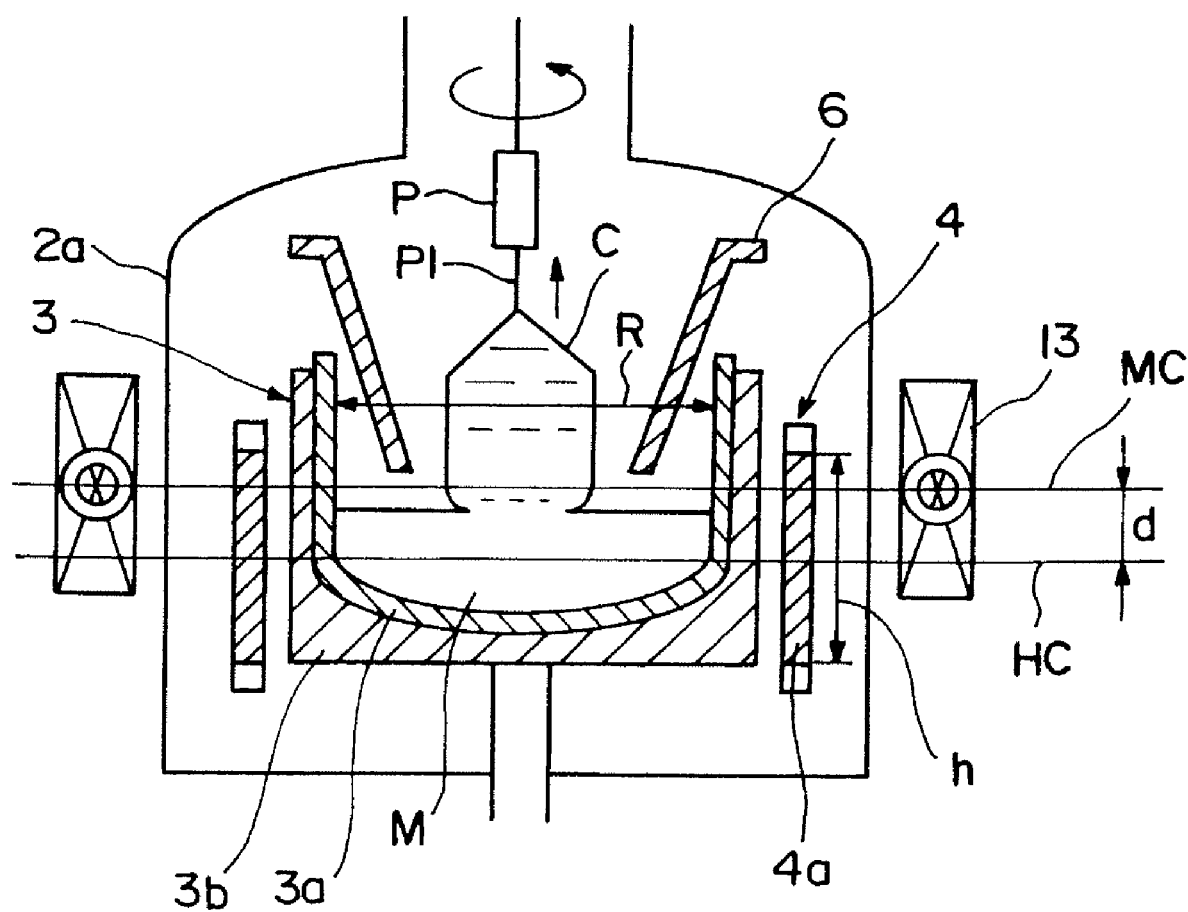
FIG. 2 is a partially enlarged view of the single crystal pulling apparatus of FIG. 1.

Here, as shown in FIG. 2, a length h in the pull-up axis direction at the slit part 4a of a heater 4 is arranged to be 0.5 times to 0.9 times an inner diameter R of the crucible 3 (for example, 800 mm or more).

This is because the silica glass crucible 3a cannot fully be heated if it is smaller than 0.5 times, and it is likely that solidification of the liquid melt M may take place starting with a surface of the inner wall and it becomes difficult to grow the single crystal.

On the other hand, this is because there is a possibility that the heater 4 may come into contact with a hot zone structure in the furnace body 2 which is complicated with increasing diameter if it is larger than 0.9 times.

Furthermore, a middle position (first middle position: height position HC) in the pull-up axis direction at the slit part 4a is located below a middle position (second middle position: height position MC) in the pull-up axis direction at the magnetic field applying electric coil 13, and a distance difference d between these middle positions is arranged to be 0.15 times to 0.55 times the inner diameter R of the crucible 3.

This is because the oxygen concentration in the single crystal becomes low, so that the single crystal with the high oxygen concentration of $1.1-1.5 \times 10^{18}$ atoms/cm$^3$ may not be easily grown over the whole length, if it is smaller than 0.15 times. On the other hand, this is because there is a possibility that the heater 4 may come into contact with the hot zone structure in the furnace body 2, if it is larger than 0.55 times.

Figure 3:
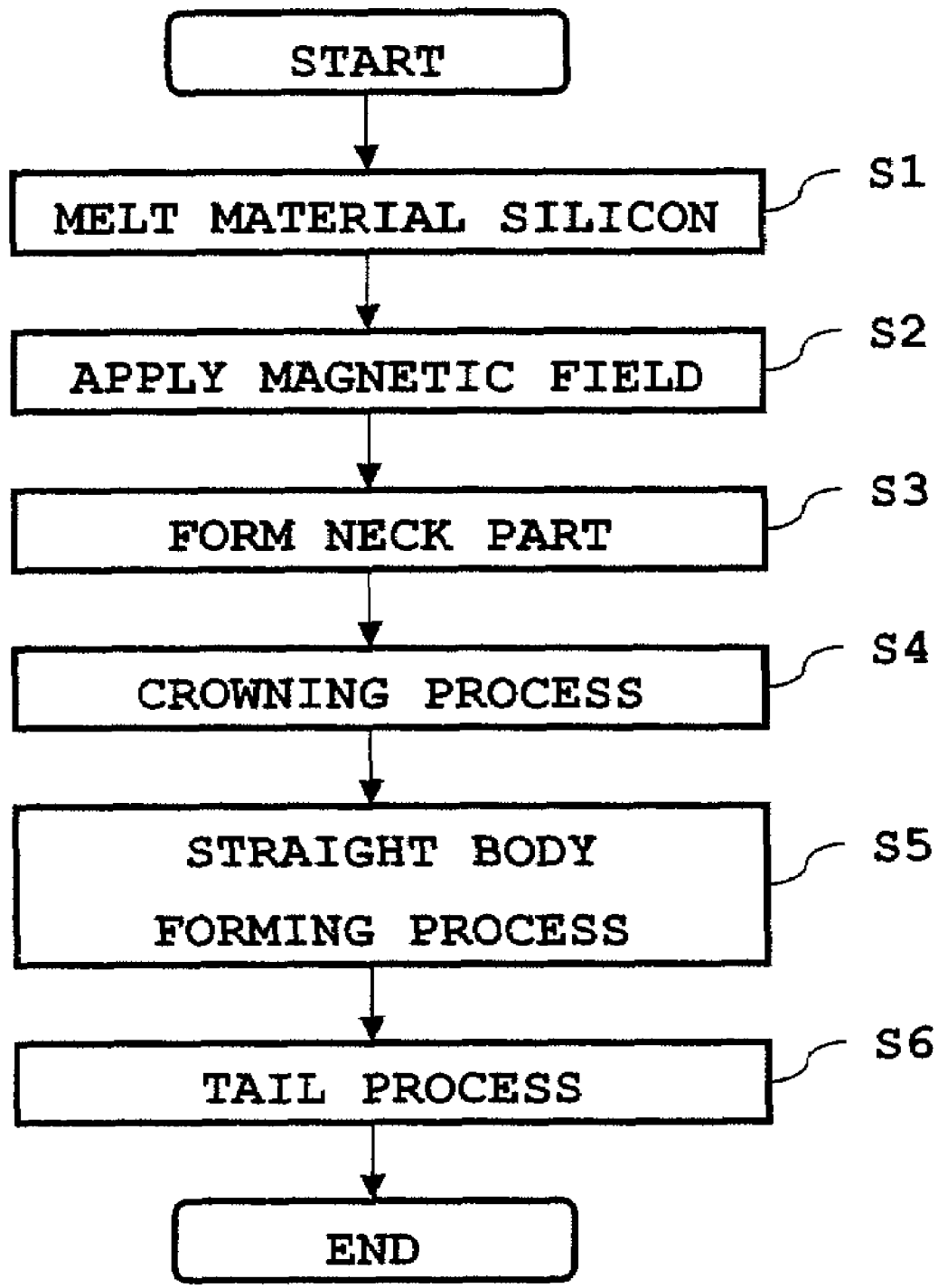
FIG. 3 is a flow chart showing a process by a method of manufacturing the single crystal in accordance with the present invention.

In the thus constructed single crystal pulling apparatus 1, a material polysilicon M is first placed in the silica glass crucible 3a and a crystal growing process is started along a flow in FIG. 3 based on a program stored in a memory storage 8a of the computer 8.

Firstly, in a state where an atmosphere control means (not shown) arranges the inside of the furnace body 2 into a predetermined atmosphere, the heater control unit 9 is operated in accordance with instructions of the arithmetic control unit 8b to heat the exothermic part 4a of the heater 4, and the material polysilicon M in the silica glass crucible 3a is melted by the thermal radiation from the exothermic part 4a (step S1 of FIG. 3).

Further, the motor control unit 10a and the lift apparatus control unit 11a are operated in accordance with instructions from the arithmetic control unit 8b, and the crucible 3 is rotated and operated at a predetermined revolving speed in a predetermined height position.

Subsequently, the electric coil control unit 13a is operated in accordance with instructions from the arithmetic control unit 8b, and predetermined current is passed by the magnetic field applying electric coil 13, whereby the magnetic field of predetermined intensity is applied in the liquid melt M (step S2 of FIG. 3).

Now, it should be noted that, as shown in FIG. 2, the length h in the pull-up axis direction at the slit part 4a which is the exothermic part of the heater 4 is arranged to be 0.5 times to 0.9 times the inner diameter R of the crucible 3 (for example, 800 mm or more). Further, in the state where the middle position (height position HC) in the pull-up axis direction at the slit part 4a is located below the middle position (height position MC) in the pull-up axis direction at the magnetic field applying electric coil 13, the distance difference d in the pull-up axis direction between these middle positions is arranged to be 0.15 times to 0.55 times the inner diameter R of the crucible 3.

In other words, it is arranged that, by maintaining such an arrangement relationship during growing of the single crystal C, the upward convection from the crucible bottom may be acquired at a sufficient degree by magnetic field application.

When a pull-up environment in the furnace body 2 is established, the wire reel rotating apparatus control unit 12 operates in accordance with instructions from the arithmetic control unit 8b, the rolling-up mechanism 5a operates, and the wire 5b is lowered.

Then, the seed crystal P attached to the wire 5b is brought into contact with the silicon liquid melt M, the necking process of melting the tip part of the seed crystal P is performed, thus forming the neck part P1 (step S3 of FIG. 3).

After the neck part P1 is formed, pull-up conditions are adjusted in accordance with instructions from the arithmetic control unit 8b, using the electric power supply to the heater 4, the pull-up speed (normally speed of several mm/min), etc. as parameters, and the single crystal pull-up processes, such as the crowning process (step S4 of FIG. 3), the straight body (forming) process (step S5 of FIG. 3), the tail process (step S6 of FIG. 3), etc. are performed in order.

As described above, according to the preferred embodiment in accordance with the present invention, in the case where the magnetic field is applied in the furnace body 2, the length h in the pull-up axis direction at the slit part 4a which is the exothermic part of the heater 4 is arranged to be 0.5 times to 0.9 times the inner diameter R of the crucible 3 (for example, 800 mm or more).

Further, in the state where the middle position in the pull-up axis direction at the slit part 4a is located below the middle position in the pull-up axis direction at the magnetic field applying electric coil 13, the distance difference d between these middle positions is arranged to be 0.15 times to 0.55 times the inner diameter R of the crucible 3.

Thus, it is possible to obtain the sufficient upward convection from the crucible bottom of the silicon liquid melt M by the magnetic field application and to easily grow the single crystal of the high oxygen concentration over the whole length.

Then, the single crystal pulling apparatus in accordance with the present invention will be further described with reference to Example.

In the present Example, actual experiments were carried out using the single crystal pulling apparatus having the structure as shown in the above-mentioned preferred embodiment, to verify the effects.

EXAMPLE 1

In Example 1, after preparing and melting 250 kg of a silicon material in a silica glass crucible having a diameter of 32 inches and an inner diameter of 800 mm, only one single crystal having a diameter of 300 mm was pulled up.

A transverse magnetic field intensity was arranged to be 3000 gausses, and an inner furnace pressure was controlled to be constant, approximately 80 Torr.

Further, as for experimental conditions, the conditions for a heater were set up such that lengths in the pull-up axis direction at a slit part of the heater were 0.4 times, 0.5 times, 0.6 times, and 0.8 times the inner diameter of the crucible.

Furthermore, a middle position in the pull-up axis direction in the slit part of the heater was arranged to be below a middle position in the pull-up axis direction in a magnetic field applying electric coil, and conditions were set up such that distance differences (considered as HC-MC distance) between these middle positions were 0.03 times, 0.1 times, 0.15 times, 0.2 times, 0.3 times, 0.4 times, and 0.5 times the inner diameter of crucible.

Figure 4:
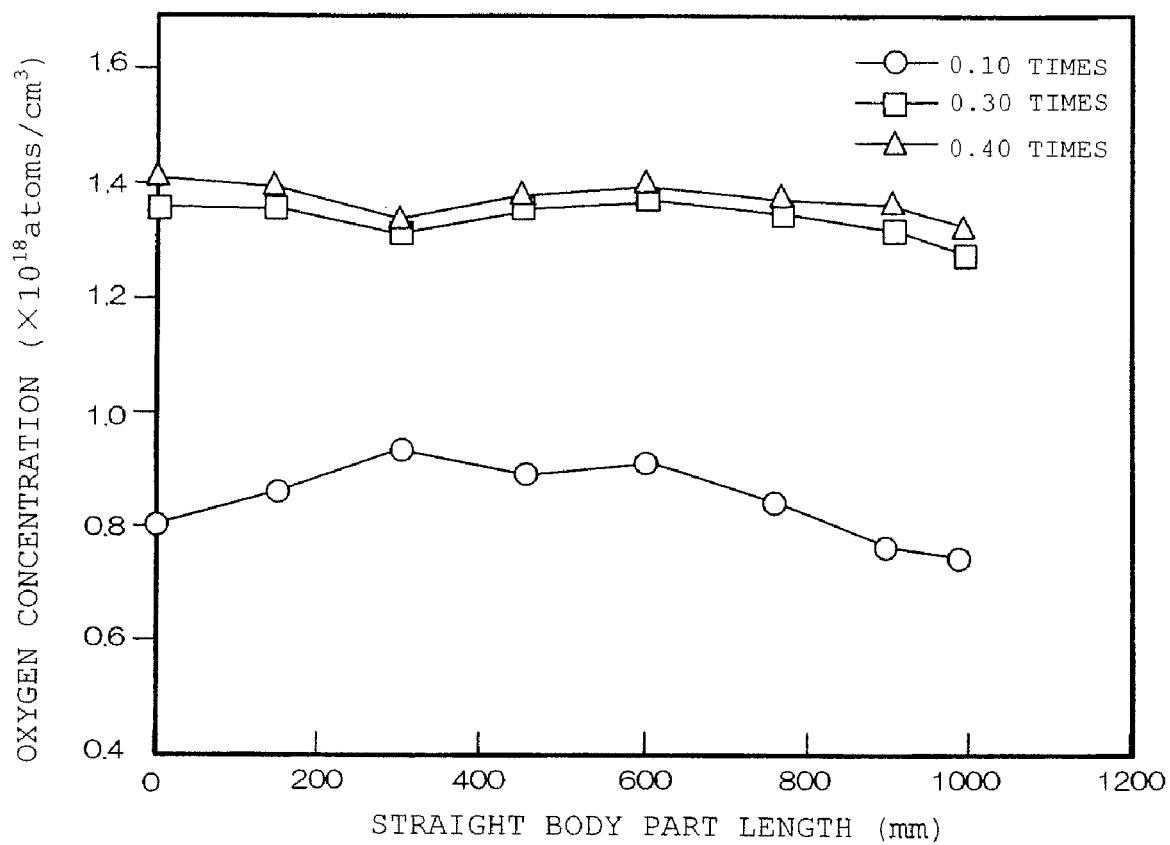
FIG. 4 is a graph showing results of Example 1.
Figure 5:
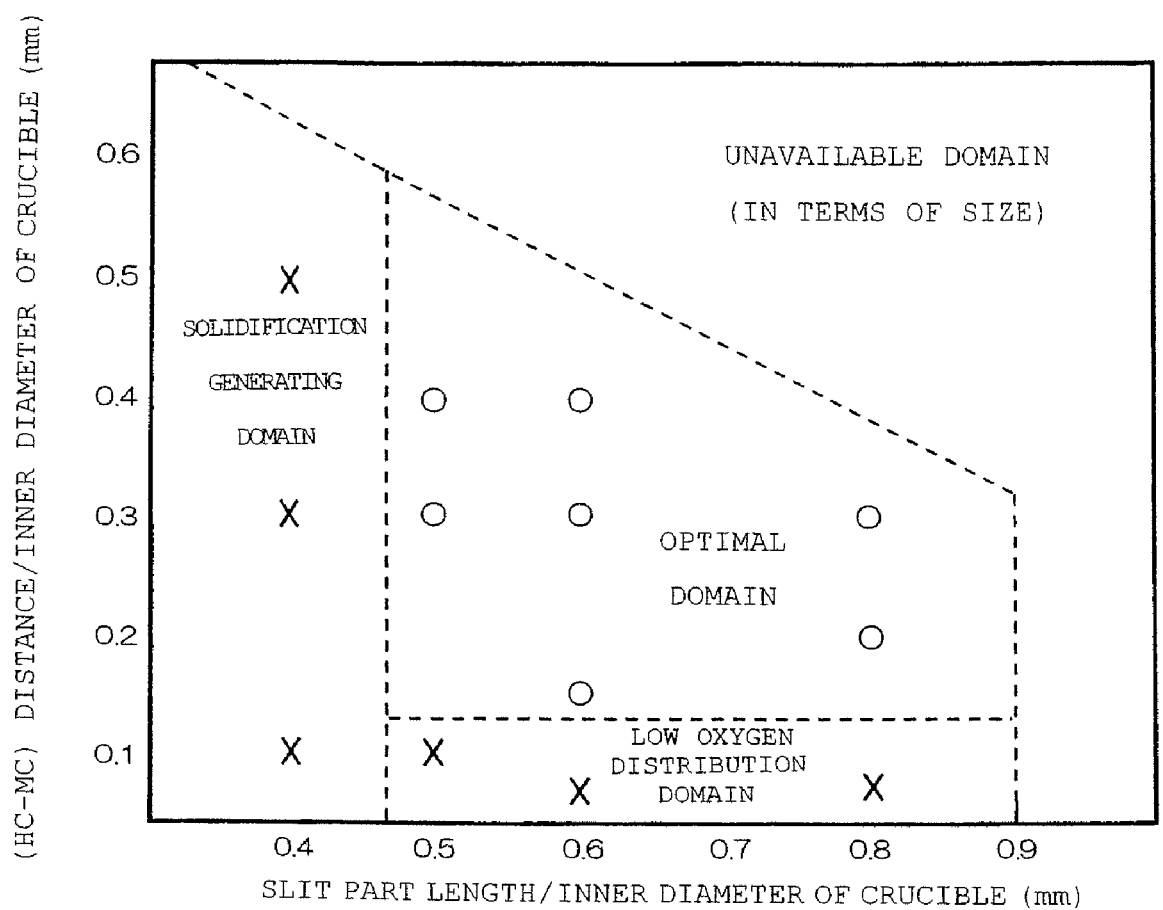
FIG. 5 is another graph showing results of Example 1.
Figure 6:
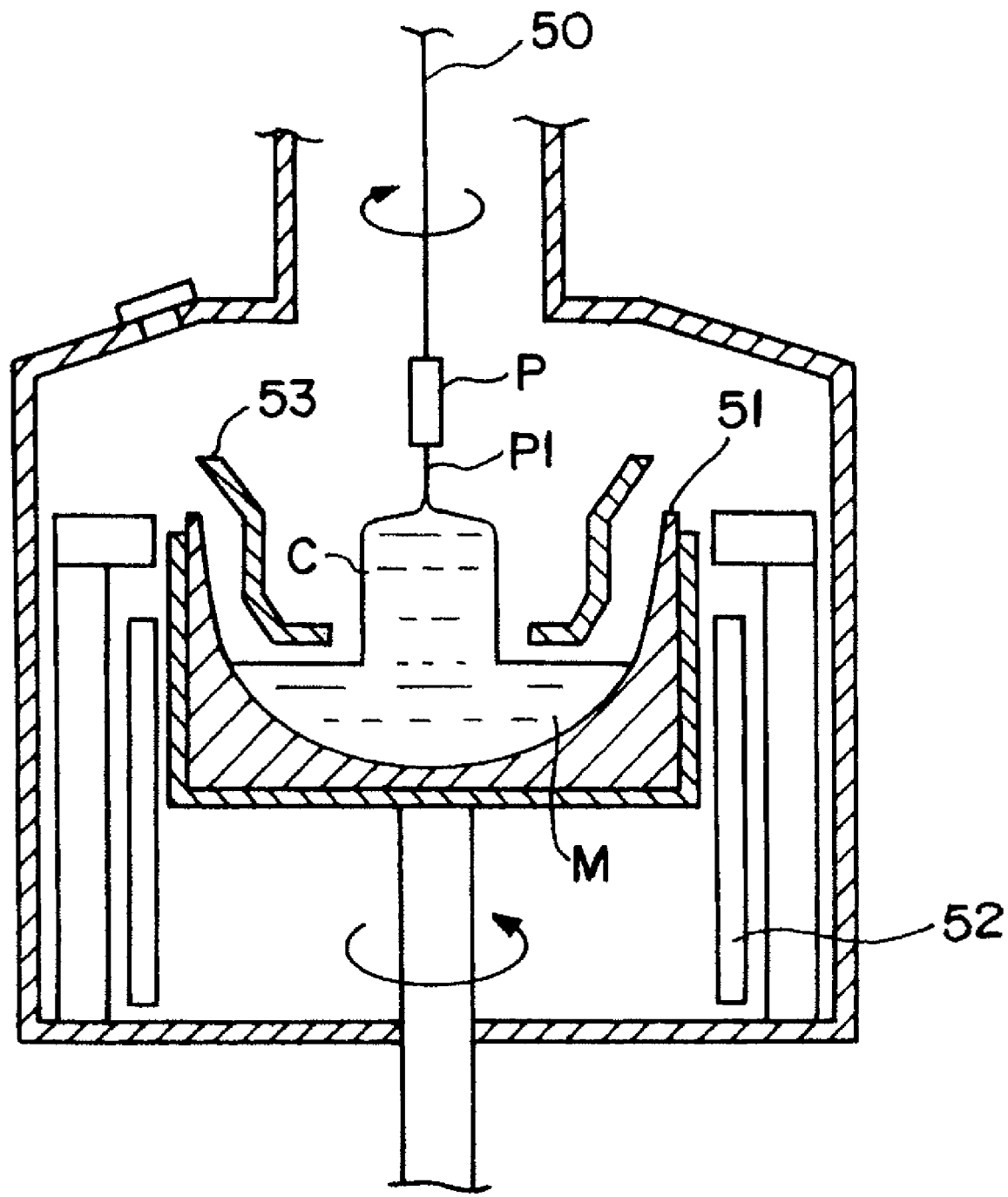
FIG. 6 is a sectional view for explaining a pull-up method using a conventional CZ method.
Figure 7:
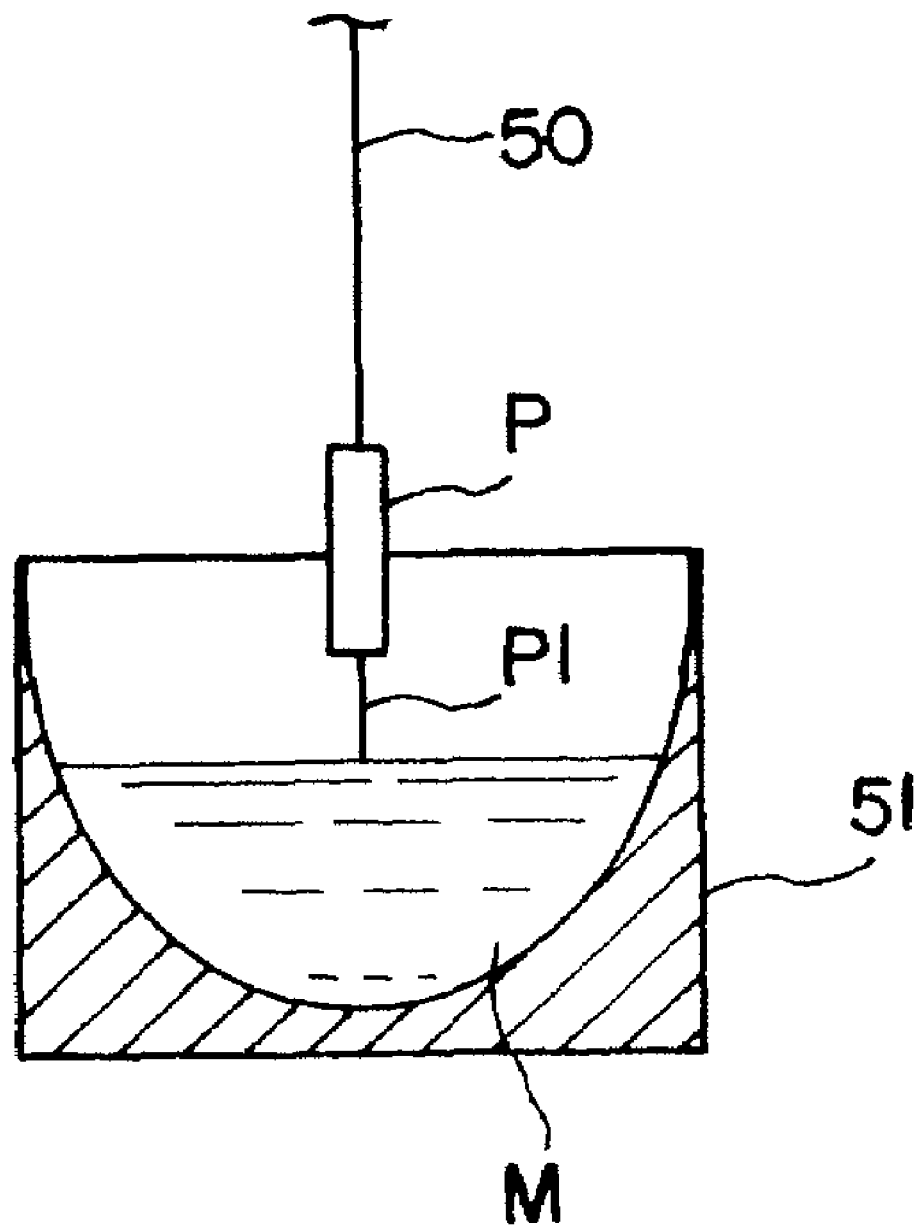
FIG. 7 is a view for explaining formation of a neck part in the pull-up method using the conventional CZ method.

The results of this experiment are shown in the graphs of FIG. 4 and FIG. 5.

FIG. 4 is oxygen concentration distribution, with respect to a single crystal full length (straight body part length), which was obtained such that the length in the pull-up axis direction at the slit part of the heater was fixed at 0.5 times the inner diameter of the crucible, and HC-MC distances were 0.1 times, 0.3 times, and 0.4 times the inner diameter of the crucible.

It can be seen from the graph of FIG. 4 that an oxygen concentration was low over the single crystal full length when the HC-MC distance was 0.1 times the inner diameter of the crucible. On the other hand, it can be seen that the oxygen concentrations were high over the single crystal full length when the HC-MC distance were 0.3 times and 0.4 times the inner diameter of the crucible.

FIG. 5 is a graph showing the optimal domain in the case where X-axis represents "slit part length/inner diameter of crucible" and Y-axis represents "(HC-MC) distance/inner diameter of crucible". The optimal domain is a domain where the single crystal with the high oxygen concentration of the oxygen concentration of $1.1\text{-}1.5 \times 10^{18}$ atoms/cm$^3$ was grown over the whole length. In addition, in this graph, reference sign "O" shows the case where the high oxygen concentration single crystal was easily grown over the whole length and reference sign "x" shows the case where a good crystal was not obtained since the solidification took place or the oxygen concentration in the crystal became low.

It can be seen from the graph of FIG. 5 that the length in the pull-up axis direction at the exothermic part of the heater was 0.5 times to 0.9 times the inner diameter of the above-mentioned crucible, and the HC-MC distance was the optimal domain in the case of 0.15 times to 0.55 times the inner diameter of the crucible.

From the experimental results of the above Example, it was confirmed that, according to the single crystal pulling apparatus of the present invention, the silicon single crystal with the high oxygen concentration could be easily obtained over the whole length.

The present invention relates to the single crystal pulling apparatus which pulls up the single crystal by the Czochralski method, and is suitably used in the semiconductor manufacture industry etc.

What is claimed is:

1. A single crystal pulling apparatus in which silicon material is melted to be a silicon liquid melt in a crucible inside a furnace body and a single crystal is pulled up from the crucible rotating about a pull-up axis by the Czochralski method, said apparatus comprising:

a heater having a cylindrical exothermic part which surrounds said crucible inside said furnace body, wherein the heater is configured to melt said silicon material by thermal radiation from said exothermic part, and an electromagnet which surrounds said furnace body and is configured to apply a transverse magnetic field to said silicon liquid melt in said crucible, and wherein a length in a pull-up axis direction in the exothermic part of said heater is arranged to be 0.5 times to 0.9 times an inner diameter of said crucible, a first middle position in the pull-up axis direction in said exothermic part is arranged below a second middle position in the pull-up axis direction in said electromagnet, and a difference in distance between the first and second middle positions is 0.15 times to 0.55 times the inner diameter of said crucible.

2. The single crystal pulling apparatus as recited in claim 1, wherein the inner diameter of said crucible is 800 mm or more.

3. The single crystal pulling apparatus as recited in claim 1, wherein the single crystal pulling apparatus is configured to provide a silicon single crystal comprising an oxygen concentration of $1.1\text{-}1.5 \times 10^{18}$ atoms/cm$^3$ over a whole length of the single crystal.

4. A single crystal pulling apparatus in which silicon material is melted to be a silicon liquid melt in a crucible inside a furnace body and a single crystal is pulled up from the crucible rotating about a pull-up axis by the Czochralski method, said apparatus comprising:

a heater having a cylindrical exothermic part which surrounds said crucible inside said furnace body, wherein the heater is configured to melt said silicon material by thermal radiation from said exothermic part, and an electromagnet which surrounds said furnace body and is configured to apply a transverse magnetic field to said silicon liquid melt in said crucible, and wherein a length in a pull-up axis direction in the exothermic part of said heater is arranged to be 0.5 times to 0.8 times an inner diameter of said crucible, a first middle position in the pull-up axis direction in said exothermic part is arranged below a second middle position in the pull-up axis direction in said electromagnet, and a difference in distance between the first and second middle positions is 0.15 times to 0.40 times the inner diameter of said crucible.

* * * * *